April 18, 1961 D. L. ORT 2,980,806
CORRECTED DIODE
Filed April 22, 1957 2 Sheets-Sheet 1

INVENTOR:
Donald L. Ort
By Seymour Schalnick
Attorney

April 18, 1961 D. L. ORT 2,980,806

CORRECTED DIODE

Filed April 22, 1957 2 Sheets-Sheet 2

INVENTOR
Donald L. Ort

By Seymour Scholnick
Attorney 2,980,806
Patented Apr. 18, 1961

2,980,806

CORRECTED DIODE

Donald L. Ort, Los Angeles, Calif., assignor, by mesne assignments, to Litton Systems, Inc., Beverly Hills, Calif., a corporation of Maryland Filed Apr. 22, 1957, Ser. No. 654,218

16 Claims. (Cl. 307—88.5)

The present invention relates to a transistor circuit which functions as a superior "corrected" diode and more particularly to a transistor clamping circuit having superior voltage regulating properties.

An ideal clamp is a component able to maintain a constant voltage at all currents above a specified current. In several types of circuits used in computer work the accuracy of the output signal of the circuit depends directly upon the accuracy to which certain voltages can be clamped. For example, in a digital to analogue current weighting and/or voltage weighting converter (digilog), the accuracy of the conversion depends directly upon the accuracy to which the digital voltages can be clamped. Further, in certain applications, such as telemetering, where a PDM (pulse duration modulated) constant voltage signal is generated to convey information, the accuracy of the transmitted information is directly dependent upon the accuracy with which an applied voltage can be clamped.

In the prior art, thermionic diode circuits were first used as voltage clamps. However, a thermionic diode has internal resistance which is substantial and when, in operation, a thermionic diode draws current, a voltage drop takes place across its internal resistance proportional to the current flow. When a thermionic diode is utilized in a clamping circuit, such voltage drops across its internal resistance directly appear as corresponding variations in the level of a clamped voltage. Thus in some cases for a required range of current a thermionic diode cannot adequately control the clamped voltage or in other words the thermionic diode is not able to adequately regulate the applied voltage.

At the present time, semi-conductor junction diodes are used in applications where accurate voltage clamping is necessary since a semi-conductor junction diode has internal resistance which is considerably less than that of a thermionic diode. However, even a semi-conductor junction diode will not provide the degree of voltage regulation desired for many difficult applications such as hereinbefore discussed. For example, when one of the best semi-conductor junction diodes is utilized in a clamping circuit, an applied signal which is to be clamped can have its clamped voltage level vary as much as one-third of a volt over a useful current range. This amount of variation in the clamped voltage severely limits the accuracy of an output signal and thereby restricts the use of conventional semi-conductor junction diode clamps for many applications. In addition to the above-described clamped voltage variation caused by voltage drop across the internal resistance of a diode, a further voltage variation occurs in semi-conductor junction diodes, in response to any abrupt change of the voltage level of an applied input signal, this variation being caused by the well-known transient response characteristic or delay time of the diode. The transient delay time is caused in part by minority carrier storage within both electrodes of the diode.

In the present invention on the other hand a superior clamping circuit is provided by utilizing one-half a transistor as a "corrected" diode in which a substantial amount of any current flowing through the diode is cancelled by a reverse current flowing through the other half of the transistor, thereby reducing any voltage drop within the diode caused by current flow through its internal resistance. Since it is the size of the internal voltage drop that limits the degree of voltage regulation of the diode, the reduction of this voltage drop will substantially reduce the voltage variation of a clamped voltage. In addition, transient voltage variations, occasioned by abrupt variations in the level of an applied input signal are reduced in the corrected diode of the invention, because it has a smaller transient delay time than an uncorrected diode of the prior art.

While a conventional diode includes a cathode electrode and an anode electrode, which may be considered as the two elements of the diode, in the corrected diode of the invention, the two elements of the corrected diode comprise the base electrode and either the emitter or collector electrode of a transistor. As stated either the emitter or collector may be used as one element of the corrected diode in conjunction with the base electrode as the other element. In operation the signal to be clamped is applied to either the emitter or collector of the transistor while the clamping voltage is applied to the base electrode and the remaining electrode of the transistor is reverse biased. If a signal to be clamped is applied to the emitter, assuming for the moment that the emitter is one element of the corrected diode, then the current flowing through the diode to the base electrode will be substantially cancelled by the reverse current flowing between the collector and the base. Since $\alpha$ (current amplification factor) is normally of the magnitude of .95 or higher, only about 5% or less of the emitter current will flow through the diode to the base electrode, thereby substantially reducing the voltage drop across the base resistance which normally comprises the greatest part of the internal resistance of the corrected diode.

As hereinbefore mentioned a diode transient delay time is ordinarily greater than that of the corrected diode of the invention, the explanation of this shorter delay time being as follows: If a turn-off step is applied at one electrode of a diode, a reverse bias is set up which tends to sweep out stored minority carriers from the interior of the diode, the turn-off step being ineffective or delayed until this operation is completed. The time required to completely sweep out the stored carriers will be a function of the widths of the cathode and anode regions. However, in the corrected diode of the invention the base electrode of a transistor is utilized as either the cathode or anode electrode of the corrected diode and the base region is ordinarily so very narrow as compared to the corresponding region of a conventional diode so that the net transient delay time is reduced.

It is therefore, an object of the invention to provide a corrected diode having superior characteristics.

Another object of the invention is to provide a transistor clamping circuit having a feedback current which substantially cancels the internal current of the transistor.

Still another object of the invention is to provide a corrected diode clamp which includes as its elements the base electrode and either the emitter or collector electrode of a transistor.

A still further object of the invention is to provide a transistor clamping circuit including the base electrode and either one of the emitter or collector electrodes of a transistor and where a substantial amount of the emitter current does not flow to the base electrode.

Yet another object of the invention is to provide a transistor clamping circuit wherein the clamping voltage is applied to the base electrode of the transistor and the signal to be clamped is applied to emitter or collector electrode of the transistor.

Yet a further object of the invention is to provide a transistor clamping circuit wherein the clamping voltage is applied to the base electrode of a transistor, the voltage to be clamped is applied to the collector electrode of the transistor, and the emitter electrode of the transistor is reverse biased.

It is also an object of the invention to provide a transistor clamping circuit wherein the clamping voltage is applied to the base electrode of the transistor, the signal to be clamped is applied to the emitter electrode of the transistor, and the collector electrode of the transistor is reverse biased.

The novel features which are believed to be characteristic of the invention, both as to its organization and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

Fig. 1*a* is a circuit diagram of a conventional prior art diode clamping circuit;

Fig. 1*b* is a circuit diagram of a transistor clamping circuit mechanized in accordance with the invention;

Fig. 1*c* is a circuit diagram of another embodiment of a transistor clamping circuit, in accordance with the present invention;

Figure 1A:
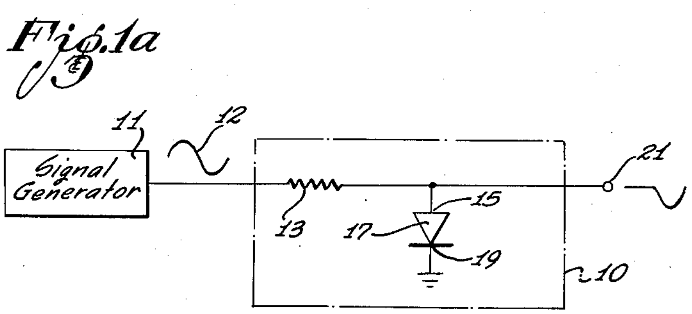
Figure 1B:
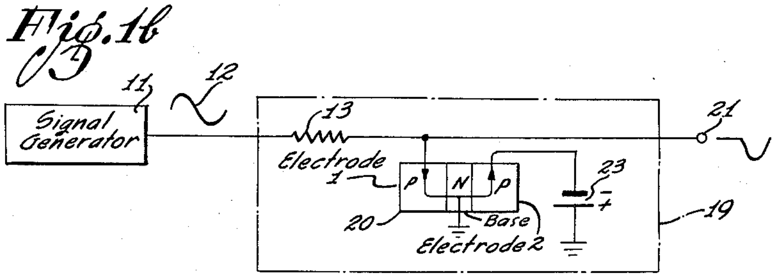
Figure 1C:
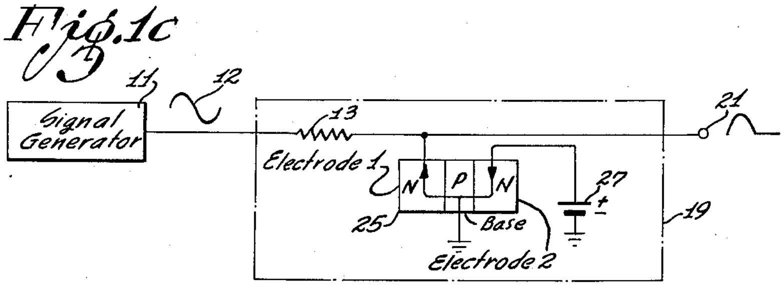

Referring now to the drawings wherein like reference characters represent like or corresponding parts throughout the several views, there is shown in Figs. 1*a*, 1*b* and 1*c* the following: A conventional prior art diode clamping circuit illustrated here for purposes of comparison; one embodiment of a transistor clamping circuit, according to the invention; and another embodiment of a transistor clamping circuit of the invention, respectively. The function of all three of the circuits hereinbefore discussed is to clamp an applied signal so as to not exceed a predetermined clamping voltage or in other words, to maintain the applied signal at a constant voltage, defined as the clamping voltage, at all currents above a specified current.

Referring now with particularity to Fig. 1*a* of the drawings, there is shown a signal generator 11 generating a signal 12, which is applied to a diode clamping circuit 10, which generates a clamped output signal at an output terminal 21. Signal 12 is applied through high impedance resistor 13 to an anode 15 of a diode 17, while a clamping voltage at ground potential is applied to a cathode electrode 19 of diode 17. Since the clamping voltage is at ground potential, signal 12 will be clamped at this value, and no higher voltages should appear at output terminal 21. As shown in Fig. 1*a*, signal 12 is a sinusoidal signal so that only the negative half of the signal will appear at output terminal 21, because current will flow through idode 17 for all positive voltage excursions of signal 12.

While theoretically signal 12 should be clamped at ground potential, in practice, diode 17 has a significant amount of internal resistance so that a potential drop is created across the diode proportional to the current flow through the diode. The diode therefore is unable, for certain application, to maintain a uniform clamping voltage throughout a useful current range. Moreover, the diode has a certain transient delay time which affects its ability to accurately maintain a uniform clamping voltage when the applied signal is rapidly varied in amplitude. Because of these limitations, conventional diode voltage clamping will not provide the degree of accuracy desired in several applications, where accurate voltage clamping is necessary, as for example, in a digital to analogue current weighting and/or voltage weighting (digilog) converter.

Referring now to Fig. 1*b*, there is shown a transistor clamping circuit 19, according to the invention, which is operable to accurately regulate an applied signal 12 which is to be clamped. As shown in Fig. 1*b*, a signal generator 11 generates a signal 12, the signal being applied to a transistor clamping circuit 19 which produces a clamped signal at output terminal 21. Signal 12 is applied through a high impedance resistor 13 to an electrode 1 of a P–N–P transistor 20. The clamping voltage is applied to the base electrode of transistor 20 and as shown in Fig. 1*b*, the clamping voltage is at ground potential. It should be noted, however, that the invention is not limited to a clamping voltage at ground potential but that any desired voltage can be used. An electrode 2 of transistor 20 is reverse biased by a potential source 23. Potential source 23 is preferably a low impedance potential source for reasons hereinafter discussed. A potential source is considered to be of low impedance if its impedance is near or at the forward impedance of the transistor while it is considered large if its impedance is large compared to the forward impedance of the transistor.

Electrodes 1 and 2 will not be specifically identified as the emitter or the collector electrode since the transistor is somewhat symmetrical in this respect, so that either the emitter or the collector electrode of the transistor may be utilized as electrode 1 of the clamping circuit of the invention, with the remaining electrode being utilized as electrode 2 of the clamping circuit. However, it will be understood that utilization of electrode 1 as the emitter electrode and electrode 2 as the collector electrode of the transistor will normally be preferred (primarily as will become clear hereinbelow, because of the greater $\alpha$ or current amplification of a transistor when used in this configuration). However, there are some applications where it is preferable to have the emitter electrode utilized as electrode 2 and the collector electrode utilized as electrode 1. For example, in applications where the applied signal has a large voltage swing it is preferable to utilize the collector as electrode 1, since the collector to base voltage rating is normally greater than the emitter to base voltage rating and therefore there is less likelihood of exceeding the voltage rating of the transistor.

Electrode 1 and the base electrode of the transistor form a diode, wherein electrode 1 corresponds to the anode electrode of a diode while the base electrode corresponds to the cathode electrode of a diode. Since the clamping voltage applied to the base electrode is at ground potential, current will flow through transistor 20 from electrode 1 to the base electrode whenever signal 12 is applied at a positive potential thereby producing an output signal at output terminal 21 which conforms to signal 12 clamped at ground. As shown in Fig. 1*b*, signal 12 is a sinsuoidal signal so that only the negative voltage half of the signal will appear at terminal 21. It should be noted, however, that the embodiment of the transistor clamping circuit of the invention is not limited to applied signals that are sinusoidal but may be utilized for clamping of any desired waveform.

Electrode 1 and the base electrode of transistor 20 will function as a simple diode, as hereinbefore discussed, even if electrode 2 were not reverse biased, but were open circuited. Under these assumed conditions the clamping circuit shown in Fig. 1*b* would of course function with all the inherent deficiencies of the simple diode clamping circuit shown in Fig. 1*a*.

The function of a reverse biased electrode 2 will now be discussed. As hereinbefore mentioned, electrode 2 is reverse biased thereby causing a reverse current to flow from the base electrode to electrode 2. The reverse current flowing from the base electrode will be opposite in direction to the diode current flowing into the base electrode from electrode 1 so that the two currents will substantially cancel each other in the base region. Since the $\alpha$ (current amplification) of commercial transistors is generally very nearly equal to 1, the reverse current will be nearly as large as the electrode 1 to base current. However, after the two currents cancel each other only a very small current difference will flow from emitter to base or in other words the diode current flowing into the base electrode will be substantially reduced. For example, the amplification factor of a 2N27 transistor, hereinafter discused, is about .95 so that the reverse current will be .95 times as large as the electrode 1 to base current. After the two currents cancel only about .05 of the electrode 1 current will flow to the base electrode.

Since the voltage drop between electrode 1 and the base electrode is dependent upon the current flow between those two points the voltage drop will be substantially less than that across an equivalent diode of the prior art. As hereinbefore discussed, it is clear that the voltage regulation of a clamping circuit is improved in proportion to the reduction of this voltage drop. Thus the accuracy of the transistor clamping circuit of the invention is substantially improved over that of circuits employing a semi-conductor junction diode, hereinbefore discussed.

In addition, the transient delay time of the present invention is shortened over that of the prior art semiconductor junction diode clamps, as hereinafter discussed, so that, the accuracy of the invention is further improved over that of a semi-conductor junction diode clamp. As hereinbefore stated, the transient delay time of a semiconductor junction diode clamp is due in part to minority carrier storage within the anode and cathode regions of the diode. The time required to deplete the minority carriers within the anode and cathode regions of a diode is a function of the widths of the two regions. Since one electrode of the corrected diode of the invention is always the base electrode of a transistor, and since the width of the base region of a transistor is normally much less than the corresponding region of a diode, the time required to deplete the minority carriers stored in the base region is reduced with respect to the corresponding region of a diode and thereby the overall transient delay time is reduced.

As hereinbefore mentioned, potential source 23 is preferably a low impedance potential source. A low impedance potential source is preferable for a number of reasons. One reason is that if a high impedance potential source is utilized, electrode 2 may become readily saturated, that is forward biased rather than reverse biased, when a large input signal is applied to electrode 1, for then a large current will flow through the electrode 2 circuit causing a voltage drop across the high impedance which may become equal to the potential source voltage. Further, there is a danger, the transistor may burn out, for in order to maintain the desired reverse bias on the electrode 2 circuit the potential source must be larger to compensate for the voltage drop across the high impedance during periods of current flow through the electrode 2 circuit, while during the remaining periods when current does not flow, the larger potential source may be so great as to burn out the transistor.

Referring now to Fig. 1*c*, there is shown another embodiment of the transistor clamping circuit of the present invention, wherein a signal generator 11 generates a sinusoidal signal 12, whose voltage is to be clamped, which is applied to a transistor clamping circuit 19, which produces a clamped output signal at output terminal 21. In the embodiment of the invention shown in Fig. 1*c*, signal 12 is clamped so as to not negatively exceed a predetermined clamping voltage, rather than to not positively exceed the clamping voltage as accomplished in the embodiment of the invention shown in Fig. 1*b*. This modification is essentially accomplished by utilizing an NPN (rather than PNP) transistor together with a corresponding change in the polarity of the reverse biasing voltage.

Signal 12 is applied through high impedance resistor 13 to electrode 1 of an NPN transistor 25. Electrode 2 of transistor 25, as shown in Fig. 1*c*, is reverse biased by a potential source 27, preferably a low impedance source, as hereinbefore discussed, and the base electrode of transistor 25 has a ground potential clamping voltage thereto applied. As hereinbefore discussed, electrodes 1 and 2 are the emitter and collector of transistor 25, however, for reasons hereinbefore mentioned, they will not be here specified. Taking note of the fact that electrode 1 is constructed of N material, current will flow between electrode 1 and base electrode 29 only if a negative potential is applied to electrode 1. Therefore, the negative half of signal 12 will flow between electrode 1 and the base electrode and will not appear at output terminal 21. Signal 12 is, therefore, clamped at ground potential and no greater negative voltage will appear at output terminal 21. The superior voltage regulation of this embodiment of the invention is attributable to the same characteristics of the transistor clamping circuit hereinbefore discussed in relation to the embodiment of the invention shown in Fig. 1*b* and need not be further discussed here, except to point out, that the diode current flows from the base electrode to electrode 1, while the reverse current flows from electrode 2 to the base electrode, as shown in Fig. 1*c*. It should be noted, that the direction of the current flow is just the reverse of that shown in the embodiment of the invention shown in Fig. 1*b*.

Figure 2:
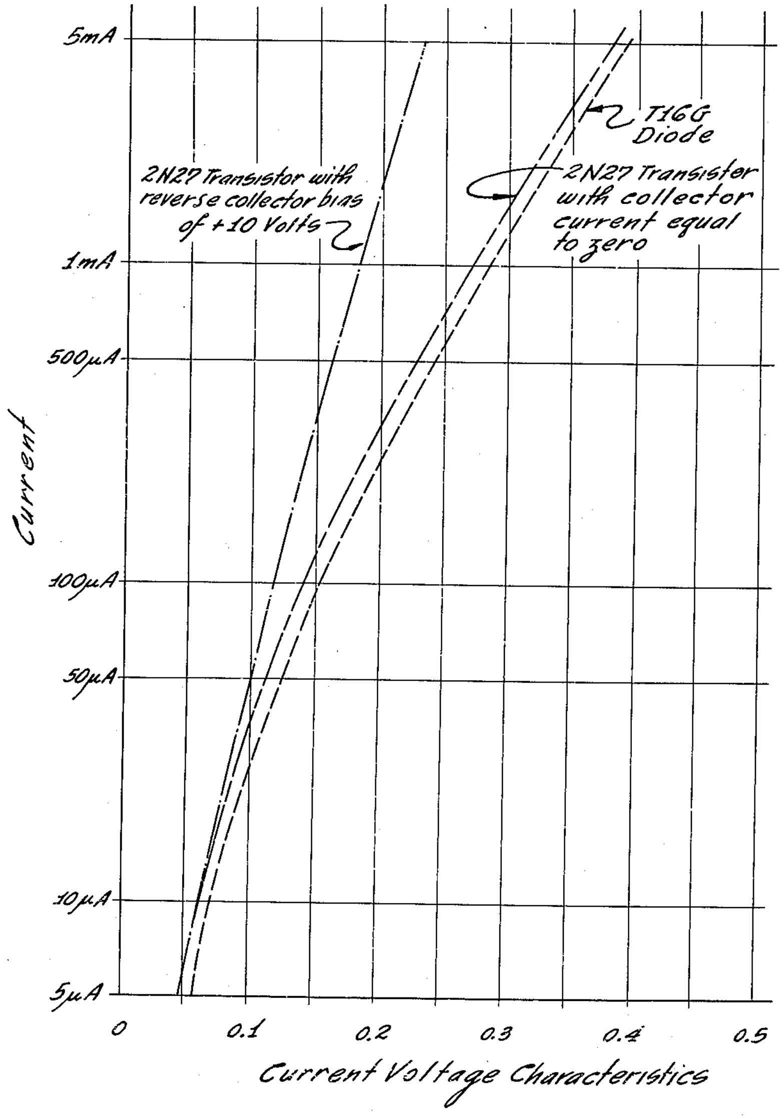
Fig. 2 is a diagram illustrating several current-voltage characteristics.

The improvement in accuracy of the voltage regulation of the transistor clamping circuit of the invention is best demonstrated by Fig. 2. There is shown in Fig. 2 a graph of the voltage current characteristics of a diode, an NPN transistor operated without a reverse biased electrode, and an NPN transistor clamping circuit mechanized in accordance with the invention. The transistor is operated in the preferred manner as hereinbefore discussed, or in other words, the emitter electrode is utilized as electrode 1 and the collector electrode is utilized as electrode 2.

In Fig. 2 the curve composed of a series of dashed marks of equal length represents the voltage-current relationship of a T16G diode manufactured by the Transitron Company. As illustrated in Fig. 2, the voltage varies from about .05 to .4 volt between 5 micro amperes and 5 milliamperes. The curve represented by a series of alternate long and short dash marks represents the voltage-current relationship of a 2N27 NPN transistor manufactured by the Western Electric Company, where the collector is open circuited, the reverse current thereby being equal to zero. As can be seen, the transistor operated in this fashion functions substantially as a simple diode and suffers from the same deficiencies as the diode. The voltage varies from .05 to about .4 volt through the same current range mentioned above. The curve composed of a series of dot and dash marks represents the voltage-current characteristics of a transistor clamping circuit mechanized in accordance with the invention, the voltage being measured across the emitter base circuit and the collector being reverse biased. As can be seen from Fig. 2, the voltage regulation of the clamping circuit of the invention is far superior to that of the diode circuit. The voltage varies only from .05 to .23 volt through the given current limits, while as hereinbefore mentioned the diode voltage varies almost twice this amount.

Figure 3:
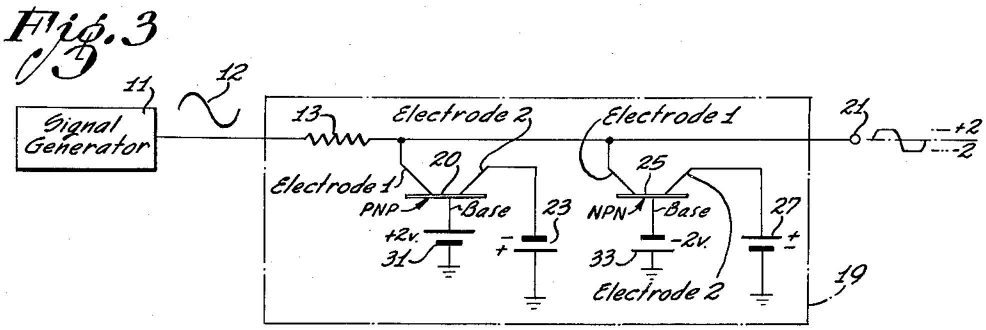
Fig. 3 is a circuit diagram of another embodiment of a transistor clamping circuit, in accordance with the present invention.

There is shown in Fig. 3 another useful embodiment of a transistor clamping circuit of the invention, wherein a signal generator 11 generates a sinusoidal signal 12, whose voltage is to be clamped, top and bottom to form a square wave output signal. Signal 12 is applied to a transistor clamping circuit 19, which produces a clamped output signal at output terminal 21. Signal 12 is applied to electrode 1 of a PNP transistor 20 and an NPN transistor 25, through a high impedance resistor 13. Electrode 2 of transistor 20 is reverse biased by a potential source 23, while electrode 2 of transistor 25 is reverse biased by a potential source 27. A clamping voltage of +2 volts is applied to the base electrode of transistor 20 from a low impedance potential source 31, while a clamping voltage of −2 volts is applied to the base electrode of transistor 25 from a low impedance potential source 33. It is necessary that potential sources 31 and 33 be low impedance potential sources, since if they are not, the clamped voltage will not be steady but will vary with the electrode 1 to base current. This is true for the same reasons hereinbefore discussed with respect to the effect of the base electrode internal resistance on the clamped voltage.

As hereinbefore discussed a PNP transistor embodiment of the invention, utilizing transistor 20, will not permit any voltage above the clamping voltage to appear at output 23, while an NPN embodiment, utilizing transistor 25, will not allow any voltage below the clamping voltage to appear at output terminal 23. Since the clamping voltage applied to transistor 20 is +2 volts and that applied to transistor 25 is −2 volts the output signal at terminal 23 will be clamped at +2 and −2 volts, thereby producing an accurate rectangular waveform.

It should be clear that numerous other alterations and modifications may be made in the transistor clamp herein disclosed without departing from the spirit and scope of the invention. For example, the clamping voltage on the base of the transistors shown in Fig. 3 may be established by use of a Zener diode in series with the base electrode, thereby producing a clamping voltage which differs from a low impedance potential source voltage, applied to the cathode of the Zener diode breakdown voltage. As another example, the reverse bias applied to electrode 2 can be similarly established by use of of a Zener diode. It should also be clear that the corrected diode of the invention is not limited in application to those applications specifically discussed hereinbefore, but can be used to advantage wherever a superior diode is desired.

Accordingly, it is expressly understood that the invention is to be limited only by the spirit and scope of the appended claims.

What is claimed as new is:

1. A transistor voltage clamp for generating an accurate clamped voltage from an applied variable amplitude input signal, said clamp comprising: a transistor having a first electrode, second electrode, and a base electrode; high impedance means for applying the input signal to said first electrode; second means for electrically reverse biasing said second electrode; and first means for applying a predetermined clamping voltage to said base electrode, whereby the clamped voltage appears at said first electrode.

2. The combination defined in claim 1 wherein said second means comprises a low impedance source of a reverse biasing potential and low impedance conductive means for applying said reverse biasing potential to said second electrode.

3. The combination defined in claim 1 wherein said first means includes a low impedance source of the predetermined clamping voltage and conductive means for directly applying the predetermined clamping voltage to said base electrode.

4. The combination defined in claim 1 wherein said transistor includes an emitter electrode and a collector electrode, said first electrode comprising the emitter electrode of said transistor and said second electrode comprising the collector electrode of said transistor.

5. The combination defined in claim 1 wherein said transistor includes an emitter electrode and a collector electrode, said first electrode comprising the collector electrode of said transistor and said second electrode comprising the emitter electrode of said transistor.

6. A voltage clamping circuit for accurately clamping an applied current input signal to a clamping voltage, said clamp comprising: transistor means including a first electrode and a base electrode; and a diode junction therebetween high impedance means for applying the input current signal to said first electrode; low impedance means for applying a predetermined clamping voltage to said base electrode; and said transistor means including operable apparatus for generating a transistor reverse current for substantially cancelling within said base electrode the applied current input signal, whereby a clamped output signal appears at said first electrode.

7. The combination defined in claim 6 which further includes a transistor, said first electrode and base electrode comprising the emitter and the base electrodes of said transistor respectively, and said transistor means including the collector and the base electrodes of said transistor.

8. The combination defined in claim 6 which further includes a transistor, said first electrode and base electrode comprising the collector and the base electrodes of said transistor, respectively, and said transistor means including the emitter and the base electrodes of said transistor.

9. A clamping circuit whereby an applied input signal is clamped in relation to an applied clamping voltage, said clamping circuit comprising: a semi-conductor having a first electrode, a second electrode, and a third electrode; high impedance means for applying the input signal to said first electrode; a low impedance source of a voltage potential for reverse biasing said second electrode; first low impedance means for applying said voltage potential to said second electrode; second low impedance means for applying the clamping voltage to said third electrode, whereby a clamped voltage is present at said first electrode.

10. A voltage clamp for accurately regulating an applied input current signal so as to not exceed a predetermined clamping voltage, said clamp comprising: a semiconductor having first and second electrodes; means for applying the input current signal to said first electrode and for applying the clamping voltage to said second electrode; and feedback means for substantially cancelling within said semi-conductor the applied input current signal, whereby an accurately clamped output voltage appears at said first electrode.

11. The combination defined in claim 10 wherein said semi-conductor further has a third electrode and said feedback means includes said second and third electrodes.

12. A transistor voltage clamp for generating an accurate clamped voltage from an applied input signal, said clamp comprising: a first and second transistor having first, second, and base electrodes wherein said first transistor is a PNP transistor and said second transistor is an NPN transistor; first means for applying the input signal to said first electrode of said first and second transistors; first and second low impedance sources of a first and second predetermined clamping voltage, respectively; a source of first and second biasing voltages; coupling means for applying said first and second biasing voltage to said second electrodes of said first and second transistors, respectively; second means for applying said first predetermined clamping voltage to said base electrode of said first transistor and said second predetermined clamping voltage to said base electrode of said second transistor, whereby the clamped voltage appears at the first electrode of both said first and second transistors.

13. The combination defined in claim 12 wherein said first means is further a high impedance means, and said second means further is for applying directly said first and second clamping voltages to said base electrodes of said first and second transistors, respectively.

14. A transistor clamp for generating an accurate clamped voltage, said clamp comprising: a transistor having a first electrode, second electrode, and a base electrode; a source of an applied variable amplitude input signal; high impedance means for applying said input signal to said first electrode; first means for forward biasing said first electrode and reverse biasing said second electrode; a low impedance source of a predetermined clamping voltage; and low impedance conductive means for applying said predetermined clamping voltage to said base electrode, whereby the clamped voltage appears at said first electrode.

15. The combination defined in claim 14 wherein said first means includes a low impedance source of a reverse biasing potential and an additional low impedance conductive means for applying said reverse biasing potential to said second electrode.

16. In a corrected diode circuit, the combination comprising: a corrected diode having an anode electrode and a cathode electrode, said corrected diode having a body portion comprising a semi-conductor transistor, one of said anode and cathode electrodes comprising the base electrode of said transistor and the other of said anode and cathode electrodes comprising a predetermined one of the emitter and collector electrodes of said transistor, said corrected diode further including means for reverse biasing the remaining one of said emitter and collector electrodes with respect to said base electrode; and apparatus for applying an electrical input signal to a predetermined one of said anode and cathode electrodes to from a corresponding output signal at said predetermined one of said anode and cathode electrodes.

References Cited in the file of this patent

UNITED STATES PATENTS

| | | |
|---|---|---|
| 2,584,259 | Crane, et al. | Feb. 5, 1952 |
| 2,698,416 | Sherr | Dec. 28, 1954 |
| 2,759,052 | MacDonald et al. | Aug. 14, 1956 |
| 2,767,330 | Marshall | Oct. 16, 1956 |
| 2,780,725 | Johanson | Feb. 5, 1957 |
| 2,788,449 | Bright | Apr. 9, 1957 |
| 2,850,650 | Meacham | Sept. 2, 1958 |
| 2,855,559 | Goodrich | Oct. 7, 1958 |
| 2,860,260 | Sykes | Nov. 11, 1958 |
| 2,863,123 | Koch | Dec. 2, 1958 |
| 2,873,387 | Kidd | Mar. 17, 1959 |
| 2,878,398 | Peterson | Mar. 17, 1959 |

FOREIGN PATENTS

| | | |
|---|---|---|
| 1,131,192 | France | Oct. 15, 1956 |